United States Patent
Chen et al.

(10) Patent No.: US 11,936,381 B1
(45) Date of Patent: Mar. 19, 2024

(54) SWITCH MODULE WITH AN AUTOMATIC SWITCHING FUNCTION ACCORDING TO LOAD AND METHOD THEREOF

(71) Applicant: Potens Semiconductor Corp., Hsinchu County (TW)

(72) Inventors: Ching Kuo Chen, Hsinchu County (TW); Wen Nan Huang, Hsinchu County (TW)

(73) Assignee: POTENS SEMICONDUCTOR CORP., Zhubei (TW)

( * ) Notice: Subject to any disclaimer, the term of this patent is extended or adjusted under 35 U.S.C. 154(b) by 0 days.

(21) Appl. No.: 17/968,985

(22) Filed: Oct. 19, 2022

(51) Int. Cl.
  *H03K 3/012* (2006.01)
  *H03K 17/567* (2006.01)
(52) U.S. Cl.
  CPC ........... *H03K 3/012* (2013.01); *H03K 17/567* (2013.01)
(58) Field of Classification Search
  CPC .............................. H03K 3/012; H03K 17/567
  See application file for complete search history.

(56) References Cited

U.S. PATENT DOCUMENTS

| | | | | |
|---|---|---|---|---|
| 11,106,231 B1* | 8/2021 | Gomes | ................... | G05F 1/575 |
| 2011/0115427 A1* | 5/2011 | Morita | ...................... | H02J 7/34 |
| | | | | 320/149 |
| 2012/0161738 A1* | 6/2012 | Nakashima | ........... | H02M 3/158 |
| | | | | 323/284 |
| 2013/0264961 A1* | 10/2013 | Chang | .................. | H04B 10/802 |
| | | | | 315/201 |
| 2016/0105111 A1* | 4/2016 | Yang | ................... | H02M 3/1563 |
| | | | | 323/271 |

* cited by examiner

*Primary Examiner* — Sibin Chen
(74) *Attorney, Agent, or Firm* — MUNCY, GEISSLER, OLDS & LOWE, PC

(57) ABSTRACT

A switch module with an automatic switching function and a method for automatically switching the switch module according to the load, wherein a first comparator and a second comparator are configured to automatically determine whether the load is light or heavy according to the voltage divided by a first resistor and a second resistor and the voltage of a source resistor, thereby generating a voltage control signal. A plurality of transistors are configured to receive a gate input signal according to the voltage control signal, thereby selectively bringing a GaN transistor or a MOSFET transistor in a conducting state. In this way, the output quality and efficiency of the power supply at light and heavy loads can be improved according to the characteristics of different transistors.

8 Claims, 3 Drawing Sheets

US 11,936,381 B1

SWITCH MODULE WITH AN AUTOMATIC SWITCHING FUNCTION ACCORDING TO LOAD AND METHOD THEREOF

BACKGROUND OF INVENTION

(1) Field of the Present Disclosure

The present disclosure particularly relates to a switch module with an automatic switching function to improve the efficiency of a power supply.

(2) Brief Description of Related Art

When the power supply responds to different application requirements, such as different loads, the output efficiency will also vary therewith. Meanwhile, when the power supply switch is turned on and off, the switching loss and the conduction loss take place, thereby making the output efficiency worse. Accordingly, how to improve the output quality and efficiency of the power supply is a problem to be resolved.

SUMMARY OF INVENTION

It is a primary object of the present disclosure to provide a switch module with an automatic switching function and a method for automatically switching the switch module according to a load, wherein a first comparator and a second comparator are configured to automatically determine whether the load is light or heavy according to a divided voltage of a first resistor and a second resistor, and a voltage of a source resistor, thereby generating a voltage control signal. A plurality of transistors are configured to receive a gate input signal according to the voltage control signal, thereby selectively bringing a GaN transistor (Gallium Nitride Field-Effect Transistor) or a MOSFET transistor (metal oxide semiconductor field effect transistor) in a conducting state. In this way, the output quality and efficiency of the power supply at light and heavy loads can be improved according to the characteristics of different transistors.

In case of heavy load, the first comparator outputs a voltage control signal to a first transistor and a second transistor. In this way, the GaN transistor can control itself in a conducting or a non-conducting state based on an external gate input signal. Due to the small switching loss and conduction loss of GaN, the efficiency of the power supply under heavy load can be improved. When the load is light, the second comparator outputs a voltage control signal to a third transistor and a fourth transistor. In this way, the MOSFET transistor can control itself in a conducting or a non-conducting state based on the external gate input signal. Due to the small switching loss of MOSFET transistor, the efficiency of the power supply under light load can be improved.

DETAILED DESCRIPTION OF PREFERRED EMBODIMENTS

Figure 1:
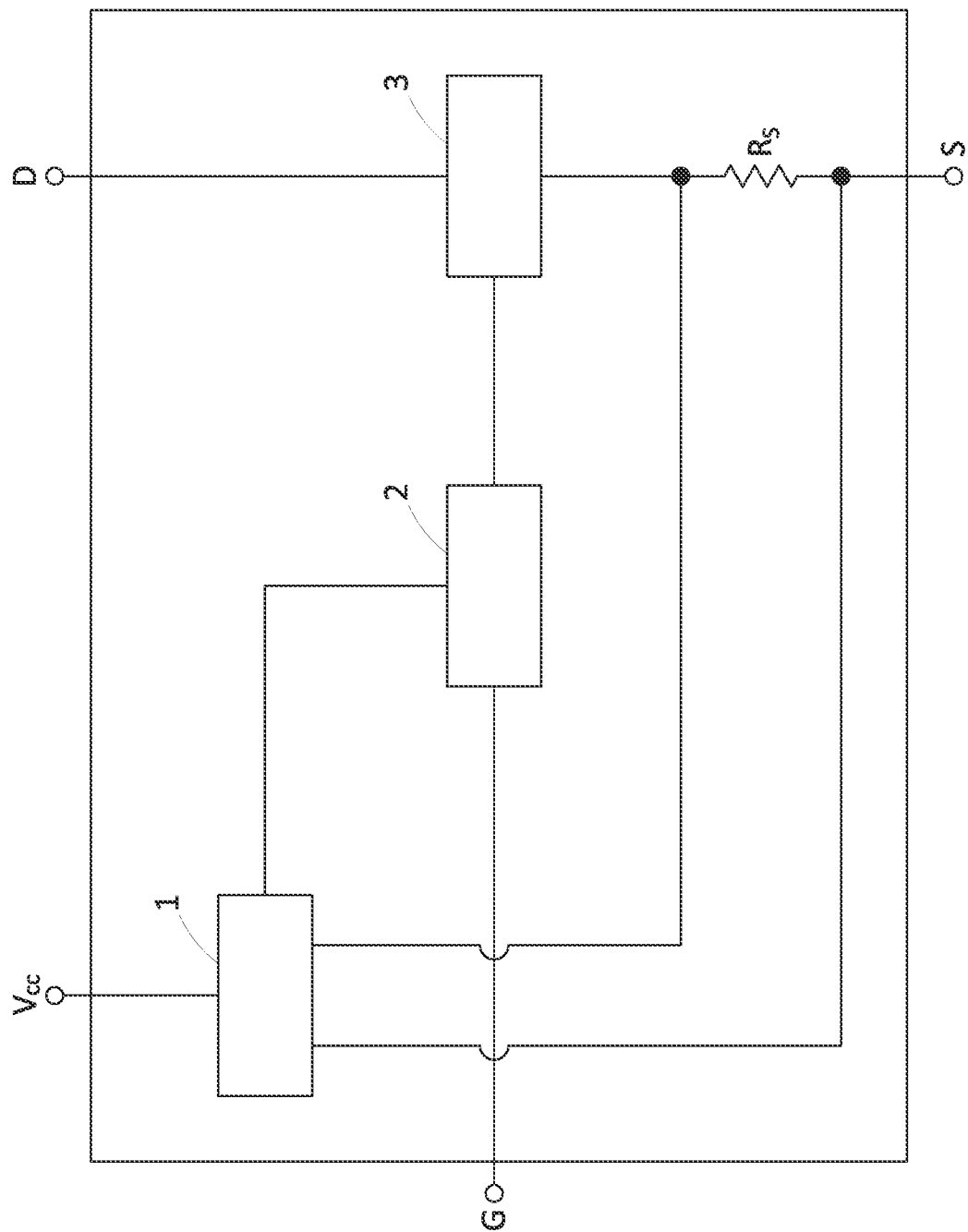
FIG. 1 is a circuit block diagram of the present disclosure.

Referring to FIG. 1, a switch module with an automatic switching function according to a load includes a control circuit 1, a drive circuit 2, a switch circuit 3, and a source resistor Rs. The above-mentioned circuits and components can be integrated into a chip, but not limited thereto. The control circuit 1 is electrically connected to a circuit voltage Vcc and a source terminal S. The drive circuit 2 is electrically connected to a gate terminal G. The switch circuit 3 is electrically connected to a drain terminal D. The source resistor Rs is electrically connected to the source terminal S.

Figure 2:
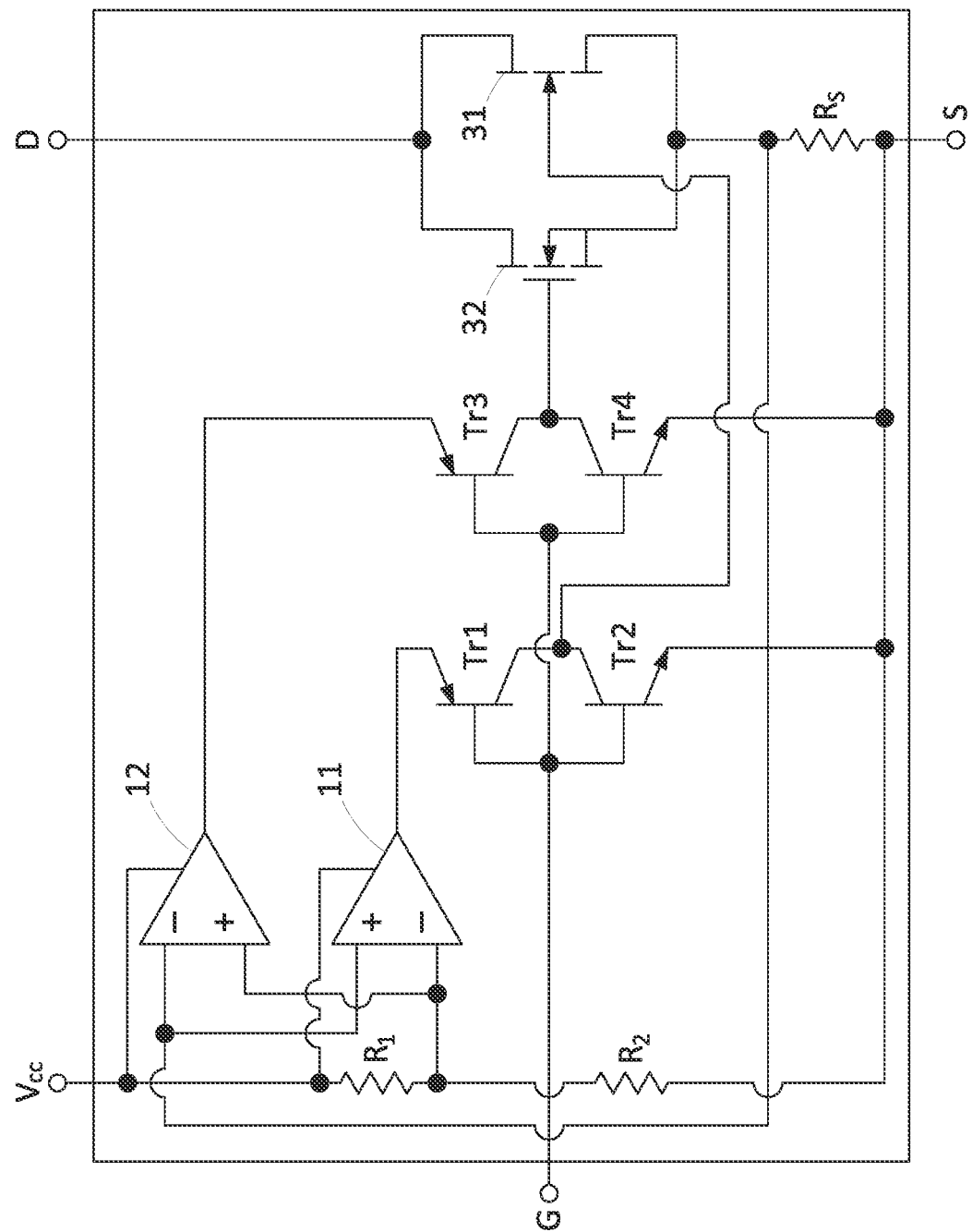
FIG. 2 is a circuit diagram of a switch module with an automatic switching function according to a load of the present invention.

Referring to FIG. 2, the control circuit 1 includes a first comparator 11, a second comparator 12, a first resistor R1, and a second resistor R2. The first comparator 11 includes a first inverting input terminal, a first non-inverting input terminal, and a first output terminal. The second comparator 12 includes a second inverting input terminal, a second non-inverting input terminal, and a second output terminal. One terminal of the first resistor R1 is electrically connected to the circuit voltage Vcc while the other terminal thereof is electrically connected to the first inverting input terminal, the second inverting input terminal, and the second resistor R2. The other terminal of the second resistor R2 is electrically connected to the source terminal S and the source resistor Rs. The other terminal of the source resistor Rs is electrically connected to the first non-inverting input terminal and the second non-inverting input terminal. In this way, the control circuit 1 can automatically determine whether the load is light or heavy according to a voltage divided by the internal resistance and a voltage generated by the external resistance, thereby generating a control signal.

Referring to FIG. 2, the drive circuit 2 includes a first transistor Tr1, a second transistor Tr2, a third transistor Tr3, and a fourth transistor Tr4. The first transistor Tr1 and the second transistor Tr2 are connected in series with each other. An emitter of the first transistor Tr1 is electrically connected to the first output terminal. A collector of the first transistor Tr1 is electrically connected to a collector of the second transistor Tr2. An emitter of the second transistor Tr2 is electrically connected to the source terminal S. A base of the first transistor Tr1 and a base of the second transistor Tr2 are electrically connected to the gate terminal G. The third transistor Tr3 and the fourth transistor Tr4 are connected in series with each other. An emitter of the third transistor Tr3 is electrically connected to the second output terminal. A collector of the third transistor Tr3 is electrically connected to a collector of the fourth transistor Tr4. An emitter of the fourth transistor Tr4 is electrically connected to the source terminal S. A base of the third transistor Tr3 and a base of the fourth transistor Tr4 are electrically connected to the gate terminal G. In this way, the drive circuit 2 receives the input signal input from the gate terminal G according to a control signal transmitted by the control circuit 1, thereby driving the switch circuit 3.

Referring to FIG. 2, the switch circuit 3 includes a first switch 31 and a second switch 32. The first switch 31 and the second switch 32 are connected in parallel with each other. A drain of the first switch 31 and a drain of the second switch 32 are electrically connected to the drain terminal D. A source drain of the first switch 31 and a source of the second switch 32 are electrically connected to the source resistor Rs. A gate of the first switch 31 is electrically connected to the collector of the first transistor Tr1 and the second transistor Tr2. A gate terminal of the second switch 32 is electrically connected to the collector of the third transistor Tr3 and the fourth transistor Tr4. The first switch 31 is a GaN transistor. The second switch 32 is a MOSFET transistor. In this way, the switch circuit 3 controls the first switch 31 or the second switch 32 according to a driving signal transmitted by the drive circuit 2.

Figure 3:
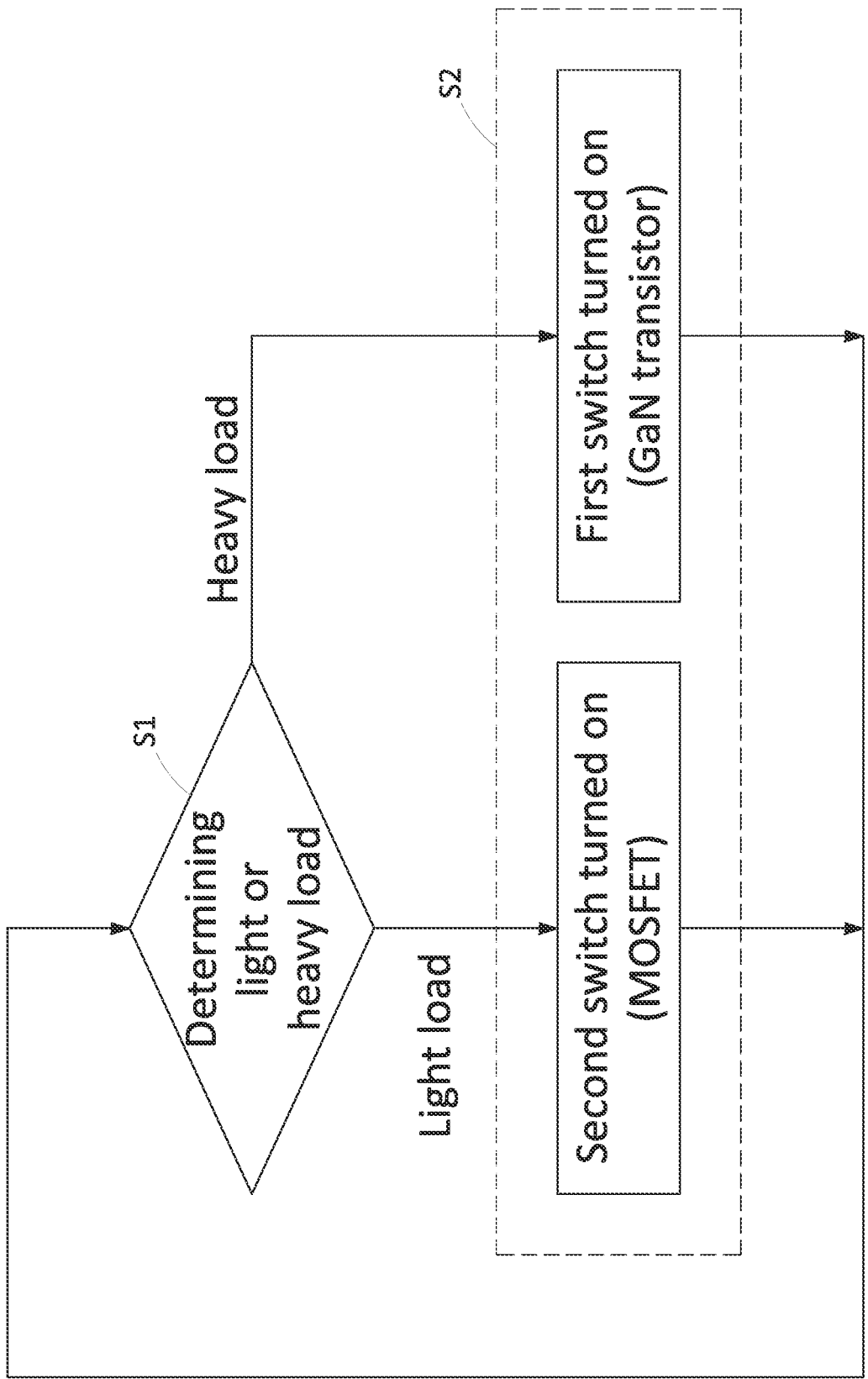
FIG. 3 is a flow chart of an automatically switching method according to the load of the present disclosure.

Referring to FIG. 3, the method for automatically switching the switch module according to the load includes the following steps:

Step S1 of determining light/heavy load: the control circuit 1 automatically determines by use of the first comparator 11 and the second comparator 12 whether the load is light or heavy according to a voltage divided by the internal resistance and a voltage generated by the external resistance, thereby generating a voltage control signal. The voltage divided by the internal resistance refers to a voltage division applied to the first resistor R1 and the second resistor R2 by the circuit voltage Vcc. By use of the first comparator 11 and the second comparator 12 and based on the voltage divided by the second resistor R2 and the voltage generated by the source resistor Rs, the control circuit 1 automatically controls the output of the voltage control signal from the first output terminal or the second output terminal in accordance with the change of light and heavy load.

Step S2 of switching the internal switch: The drive circuit 2 uses the first transistor Tr1, the second transistor Tr2, the third transistor Tr3, and the fourth transistor Tr4, based on the voltage control signal, to transmit a gate input signal received from the gate terminal G to the switch circuit 3 to selectively turn on the first switch 31 or the second switch 32. The first switch 31 is a GaN transistor, and the second switch 32 is a MOSFET transistor.

When the overall load of the circuit is heavy, the voltage of the source resistor Rs is greater than the voltage divided by the second resistor R2. In this case, the first comparator 11 outputs a voltage control signal to the first transistor Tr1 and the second transistor Tr2. The first switch (GaN transistor) thus accepts the gate input signal from the external input, thereby entering into the conducting/non-conducting state. Since the switching and conduction losses of GaN transistors are small, the efficiency of the circuit under heavy load can be improved.

When the overall load of the circuit is light, the voltage of the source resistor Rs is smaller than the voltage divided by the second resistor R2. In this case, the second comparator 12 outputs a voltage control signal to the third transistor Tr3 and the fourth transistor Tr4. The second switch (MOSFET transistor) thus accepts the gate input signal from the external input, thereby entering into the conducting/non-conducting state. Since the switching and conduction losses of MOSFET transistors are small, the efficiency of the circuit at light load can be improved.

According to the present disclosure, the control circuit 1 automatically determines by use of the first comparator 11 and the second comparator 12 whether the load is light or heavy according to the voltage divided by the first and the second resistor and the voltage of the source resistor, thereby generating a voltage control signal. Then a plurality of transistors is configured to receive the gate input signal based on the aforementioned voltage control signal to selectively bring the GaN transistor or the MOSFET transistor in a conducting/non-conducting state. In this way, when the circuit is under light and heavy load, the output quality and efficiency of the power supply under light and heavy load can be improved according to the characteristics of different transistors. After the implementation of the present disclosure, the output quality and efficiency of the power supply can indeed be improved.

REFERENCE SIGN 1 control circuit
11 first comparator
12 second comparator
2 drive circuit
3 switch circuit
31 first switch
32 second switch
R1 first resistor
R2 second resistor
Rs source resistor
Tr1 first transistor
Tr2 second transistor
Tr3 third transistor
S source terminal
G gate terminal
D drain terminal
Vcc circuit voltage

What is claimed is:

1. A method for automatically switching a switch module according to a load, comprising:
   automatically determining, by a first comparator and a second comparator, whether the load is light or heavy according to a voltage divided by a first resistor and a second resistor, and a voltage of a source resistor, and generating, by the first comparator or the second comparator, a voltage control signal; and
   transmitting, by a plurality of transistors, a received gate input signal to a first switch or a second switch according to the voltage control signal to selectively bring the first switch or the second switch in a conducting state, wherein the first switch is a GaN transistor and the second switch is a MOSFET transistor.

2. The method for automatically switching the switch module according to the load as claimed in claim 1, wherein, when the load is heavy, the first comparator outputs the voltage control signal to a part of the transistors to selectively bring the first switch in a conducting state.

3. The method for automatically switching the switch module according to the load as claimed in claim 1, wherein, when the load is light, the first comparator outputs the voltage control signal to a part of the transistors to selectively bring the second switch in a conducting state.

4. A switch module with an automatic switching function according to a load, comprising:
   a source resistor;
   a control circuit, electrically connected to the source resistor, and having a first comparator, a second comparator, a first resistor, and a second resistor, wherein the control circuit is configured to automatically determine, by the first comparator and the second comparator, whether the load is light or heavy according to a voltage divided by the first resistor and the second resistor, and a voltage of the source resistor, and generate, by the first comparator or the second comparator, a voltage control signal;
   a drive circuit electrically connected to the control circuit and a switch circuit, wherein the drive circuit is configured to transmit a received gate input signal to the switch circuit according to the voltage control signal; and
   the switch circuit comprising a first switch and a second switch, wherein the switch circuit is configured to bring the first switch or the second switch in a conducting state according to the gate input signal, wherein the first switch is a GaN transistor and the second switch is a MOSFET transistor.

5. The switch module with the automatic switching function according to the load as claimed in claim 4, wherein the first comparator comprises a first inverting input terminal and a first non-inverting input terminal, the first inverting input terminal is electrically connected to the first resistor and the second resistor, and the first non-inverting input terminal is electrically connected to the source resistor; and wherein the second comparator comprises a second inverting input terminal and a second non-inverting input terminal, the second inverting input terminal is electrically connected to the source resistor, and the second non-inverting input terminal is electrically connected to first resistor and the second resistor.

6. The switch module with the automatic switching function according to the load as claimed in claim 4, wherein the drive circuit comprises a first transistor, a second transistor, a third transistor, and a fourth transistor, the first transistor and the second transistor are connected in series, the third transistor and the fourth transistor are connected in series, and wherein a base of each of the first transistor, the second transistor, the third transistor, and the fourth transistor is electrically connected to a gate terminal.

7. The switch module with the automatic switching function according to the load as claimed in claim 4, wherein the first switch and the second switch are connected in parallel with each other, a drain of the first switch and a drain of the second switch are electrically connected to a drain terminal, a source of the first switch and a source of the second switch are electrically connected to the source resistor, a gate of the first switch is electrically connected to a collector of the first transistor and a collector of the second transistor, and a gate of the second switch is electrically connected to a collector of the third transistor and a collector of the fourth transistor.

8. The switch module with the automatic switching function according to the load as claimed in claim 4, wherein the first resistor is electrically connected to a circuit voltage, and wherein the source resistor is electrically connected to a source terminal.

\* \* \* \* \*